United States Patent [19]
Halstead

[11] Patent Number: 5,471,017
[45] Date of Patent: Nov. 28, 1995

[54] NO FIXTURE METHOD TO CURE DIE ATTACH FOR BONDING IC DIES TO SUBSTRATES

[75] Inventor: Linden T. Halstead, Temple, Tex.

[73] Assignee: Texas Instruments Incorporated, Dallas, Tex.

[21] Appl. No.: 250,977

[22] Filed: May 31, 1994

[51] Int. Cl.$^6$ .................................................. F05K 1/00
[52] U.S. Cl. .................... 174/260; 174/250; 174/255; 174/259; 361/760; 361/762; 361/765; 361/813
[58] Field of Search .................................... 174/260, 250, 174/255, 258, 259; 361/748, 760, 762, 765, 813, 767, 768

[56] References Cited

U.S. PATENT DOCUMENTS 5,371,328  12/1994  Gutierrez et al. .

Primary Examiner—Leo P. Picard
Assistant Examiner—Cheryl R. Figlin
Attorney, Agent, or Firm—Ronald O. Neerings; James C. Kesterson; Richard L. Donaldson

[57] ABSTRACT

A no fixture method to cure die attach for bonding IC dies (16) to substrates in which a solvent is applied to top and bottom surfaces of a thermoplastic die attach film (14), prior to component placement of the die (16) on a lead frame die support pad or on a printed circuit board PCB (12). The die attach film (14) is bonded to the IC die (16) and the lead frame, or to the IC die (16) and the printed circuit board PCB (12) upon drying of the solvent.

19 Claims, 6 Drawing Sheets

NO FIXTURE METHOD TO CURE DIE ATTACH FOR BONDING IC DIES TO SUBSTRATES

FIELD OF THE INVENTION

The present invention relates to the field of integrated circuit devices. More specifically, the present invention relates to a no fixture method to cure die attach for bonding IC dies to substrates.

BRIEF DESCRIPTION OF THE DRAWINGS

The novel features believed characteristic of the invention are set forth in the appended claims. The invention itself, however, as well as other features and advantages thereof, will be best understood by reference to the detailed description, read in conjunction with the accompanying drawings, wherein:

BACKGROUND OF THE INVENTION

Figure 1:
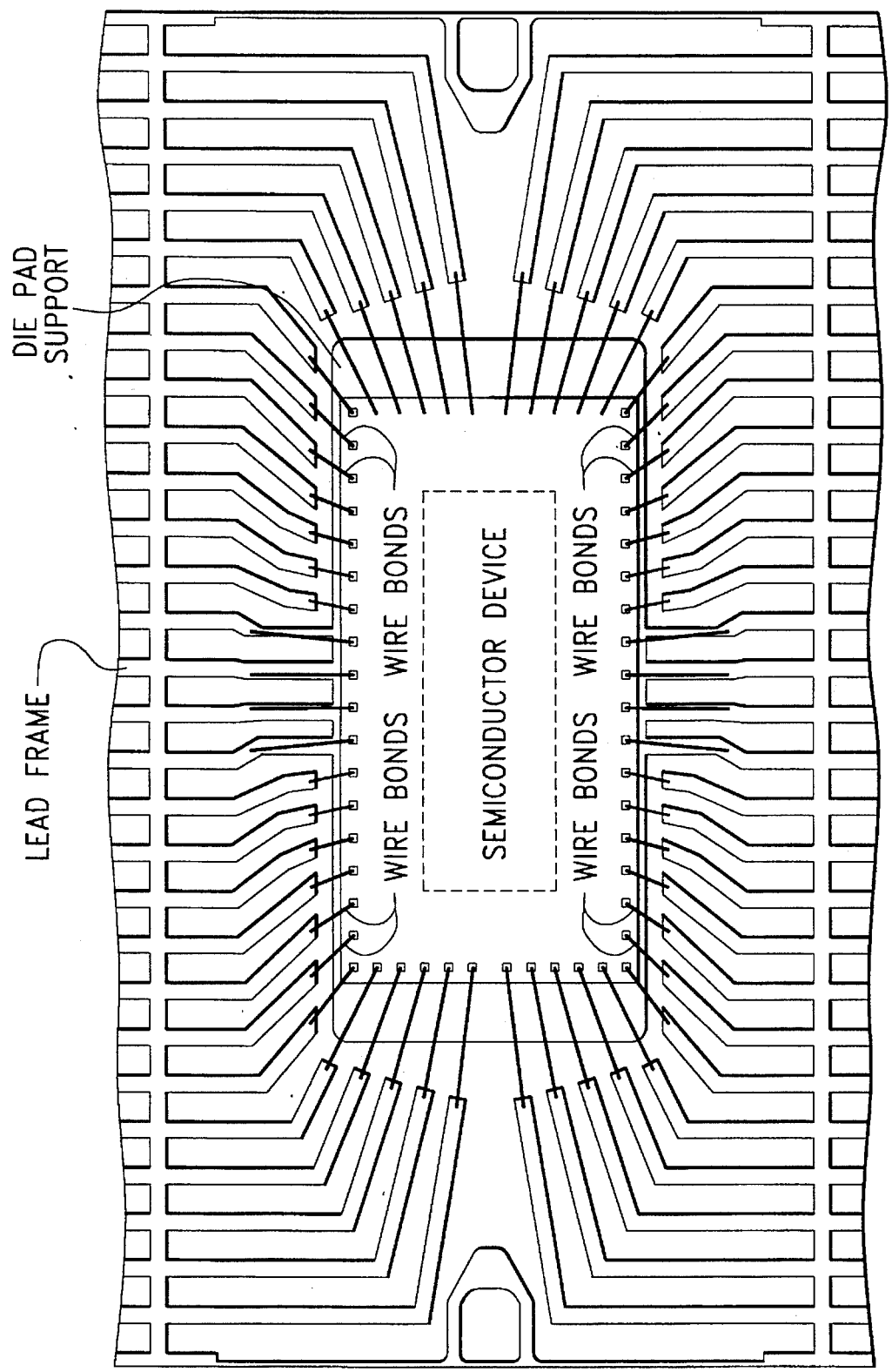
FIG. 1 illustrates a top view of a semiconductor device backbonded and wire bonded to a lead frame in a conventional manner prior to packaging.
Figure 2:
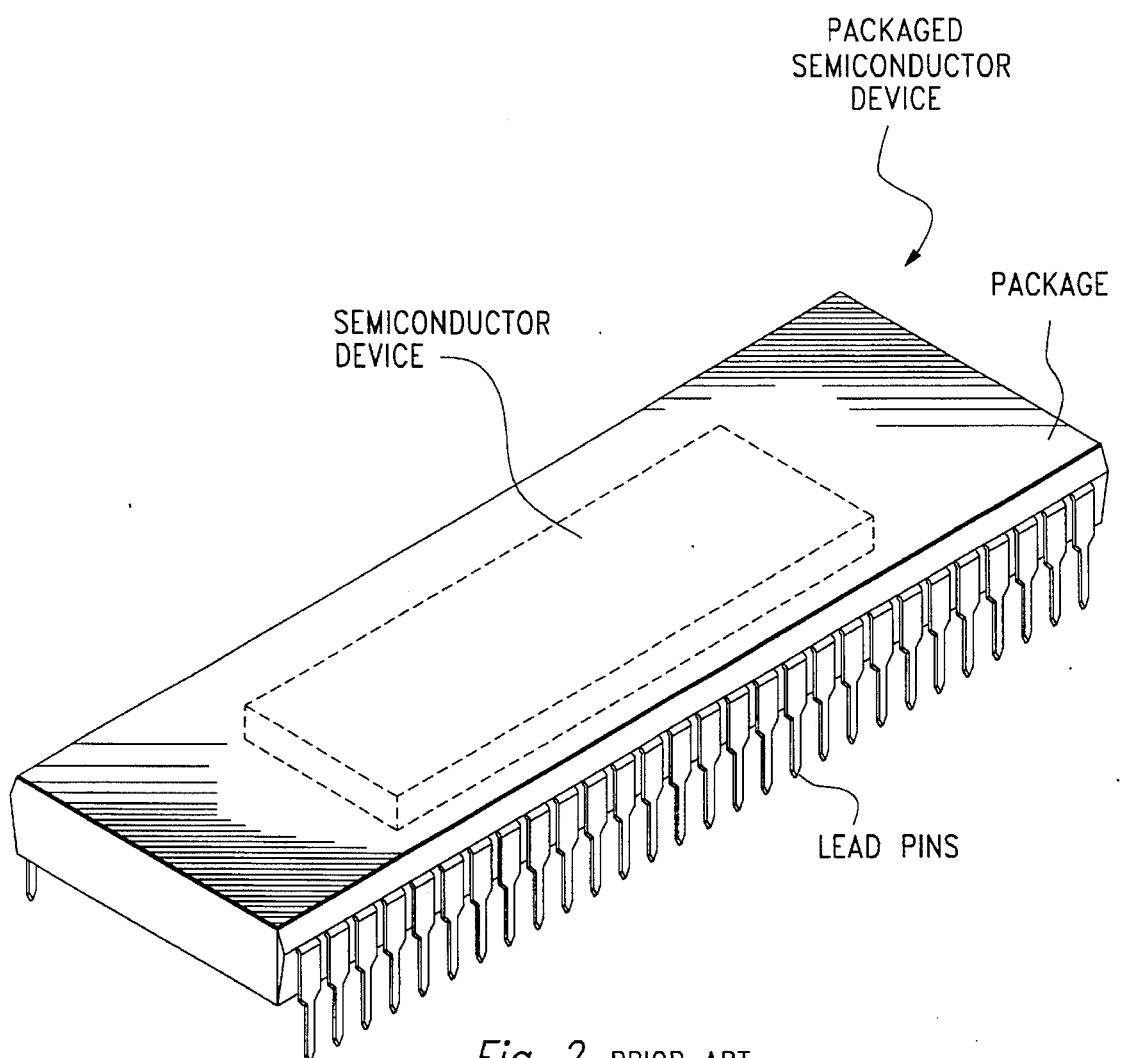
FIG. 2 illustrates an elevational view of a packaged semiconductor device having lead pins.
Figure 3:
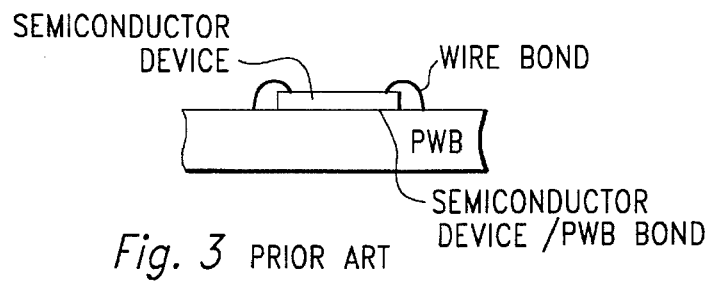
FIG. 3 illustrates a side view of a semiconductor device backbonded and wire bonded to a surface of a printed wiring board (PWB).
Figure 4:
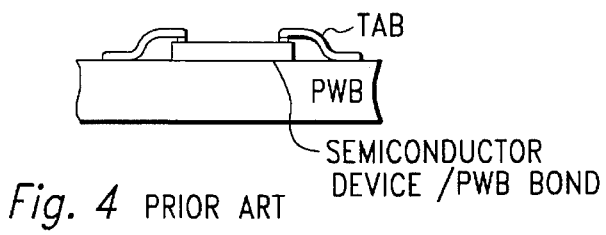
FIG. 4 illustrates a side view of a semiconductor device backbonded to a surface of a printed wiring board (PWB). A tape automated bonded (TAB) package electrically connects the semiconductor device to the printed wiring board.

Chip backbonding and heat-sink attachment involve a complete layer of adhesive. Chips may be joined to substrates with mechanical and thermal properties as diverse as ceramic chip carriers, organic PWBs, copper heat sinks, and Kovar lead frames. Except for power transistors, the backbond serves no electrical function or is at most a ground contact. Power devices can carry high current, but only a small percentage of the area is required for conductivity. FIG. 1 illustrates a semiconductor device (die) backbonded and wire bonded to a lead frame in a conventional manner prior to packaging. FIG. 2 illustrates the device of FIG. 1 after packaging is complete. FIG. 3 illustrates an unpackaged semiconductor device backbonded, and wire bonded, directly to a printed wiring board (PWB). FIG. 4 illustrates a tape automated bonded (TAB) packaged semiconductor device backbonded directly to a printed wiring board (PWB).

Die-bond adhesives fall into two categories, soft and hard. Soft adhesives include lead-based solders and organics, primarily epoxies and polyimides, which are filled with thermally conductive particles. Thermal mismatch between the die and heat sink or board is absorbed primarily by the bond itself, making it susceptible to fatigue fracture or disbonding but transmitting little damaging stress to the die. Hard adhesives include gold-based eutectics (AuSi, AuSn, AuGe) and, recently, filled glass. Bonds of these materials are highly resistant to fatigue but transfer high mismatch stress to the device, which could lead to die cracking.

Both silicon/gold eutectic (hard) and polymer (soft) bonding are used to bond a chip to a substrate or lead frame. Automated hard and soft bonding operations begin with the loading of a film ring holder, with sawed wafer attached, onto the index stage of the bonding machine. Lead frames are fed from magazines along a track to a heater block. When hard bonding, a small square of silicon/gold alloy (6% Si, 94% Au) is cut from a feed ribbon and transferred to the chip support platform. An optical scanner detects a good chip on the sawed wafer causing a probe to push the chip above the wafer plane where a collet picks it up, and transfers it to the heated chip support platform. Chip and eutectic are now scrubbed together by the collet, forming a hard alloy bond. Heater temperature is approximately 420° C. Total cycle time for eutectic bonding is about 6 to 8 seconds.

Polymer bonding is faster than eutectic with a cycle time of 2 seconds. Feed mechanisms for polymer bonding machines are the same as eutectic bonders. However, lead frames are not heated. Silver-filled epoxy or polyimide adhesive liquid, paste, or tape is transferred to a chip support platform or a printed circuit board (PCB) by a print head, and the chip is pressed into the liquid, paste, or tape immediately after printing. Chip bonded lead frame strips are loaded into transport magazines. Eutectic bonded frames go directly to wire bonding while magazines containing polymer-bonded frames are routed to ovens for adhesive curing. The curing atmosphere is dry nitrogen, and typical schedules are one hour at 150° C. for epoxies, and 30 minutes at 150° C., followed by 30 minutes at 275° C. for polyimides.

Unfortunately, there are temperature and adhesive related problems with the aforementioned die attach processes. Temperature is a problem in that the high temperatures required for curing die attach thermoplastic film are often above the glass transition temperature (Tg) of printed circuit board (PCB) material (FR4). This problem is of particular concern to semiconductor manufacturers making tape-automated bonding TAB PWB assemblies. Adhesives are problematic in that liquid and paste adhesives require low temperature storage, have a short shelf life, and are difficult to rework. Moreover, present backbonding techniques require expensive high temperature resistant fixtures and expensive pressure application fixtures. A die attach method overcoming one or more of these problems is needed.

SUMMARY OF THE INVENTION

The present invention disclosed herein discloses a no fixture method to cure die attach for bonding IC dies to substrates in which a solvent is applied to top and bottom surfaces of a thermoplastic die attach film, prior to component placement of the die on a lead frame die support pad or on a printed circuit board PCB. The die attach is bonded to the IC die and the lead frame, or to the IC die and the printed circuit board PCB upon drying of the solvent.

DETAILED DESCRIPTION OF THE INVENTION

One solution to the problem of die attach curing temperatures above the glass transition temperature (Tg) of printed circuit board (PWB) material (FR4) involves softening the die attach film at the PWB/die attach and die/die attach interfaces with a solvent, prior to IC die placement.

Figure 5:
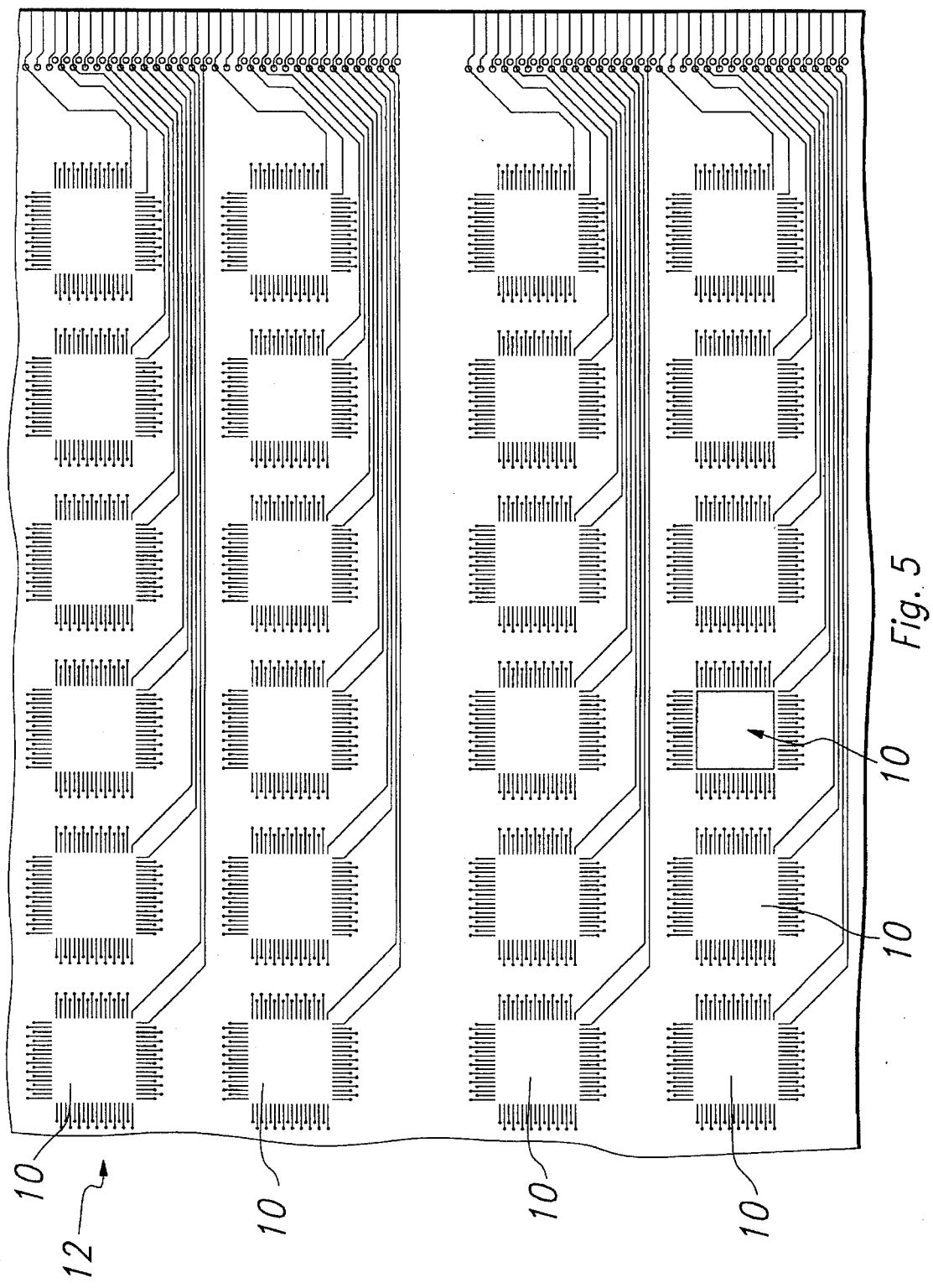
FIG. 5 illustrates a top view of a printed wiring board (PWB) having multiple thermal pads on which semiconductor devices are to be mounted.
Figure 6:
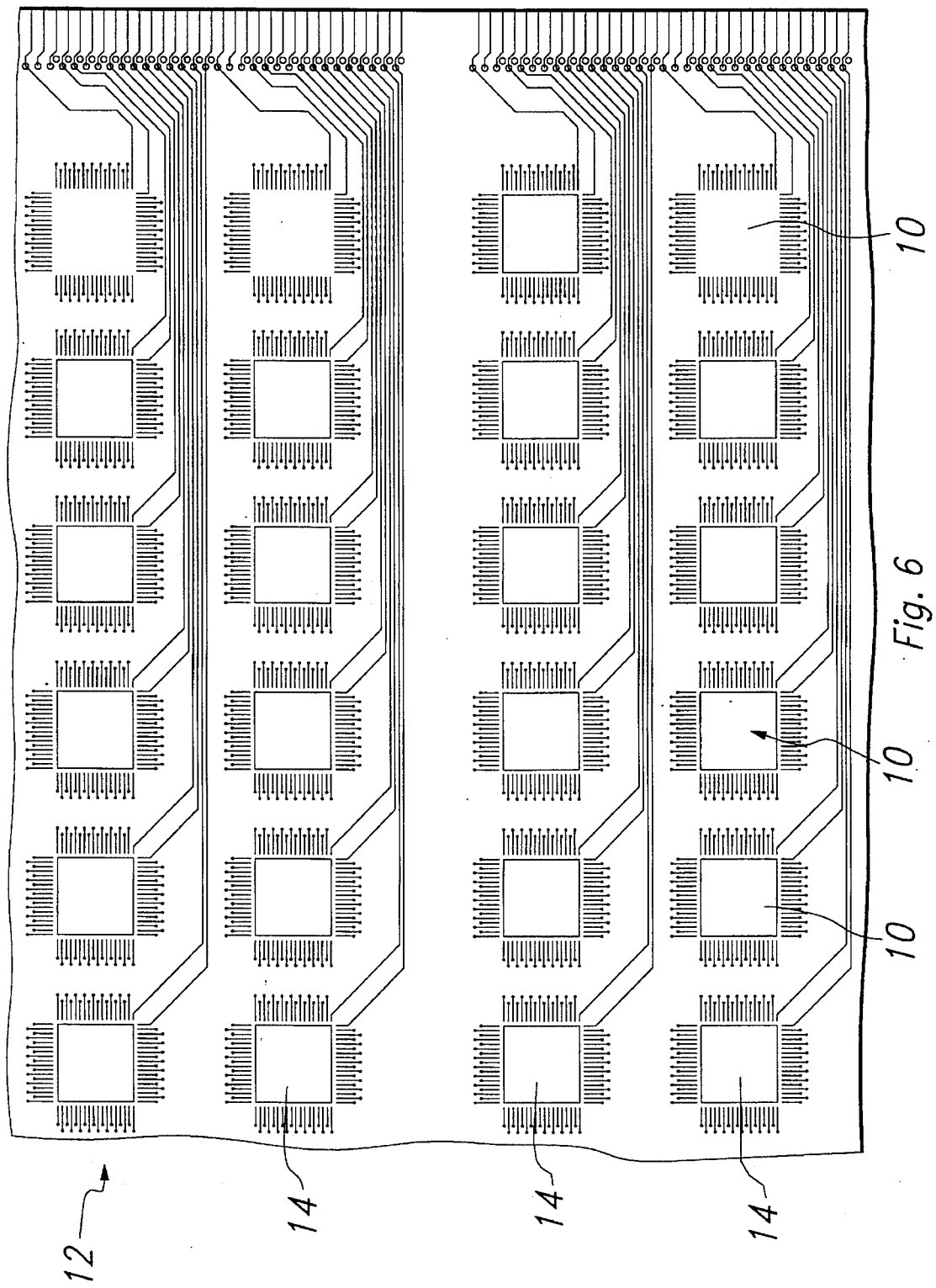
FIG. 6 illustrates the printed wiring board (PWB) of FIG. 5, further including die attached films placed on the multiple thermal pads.
Figure 7:
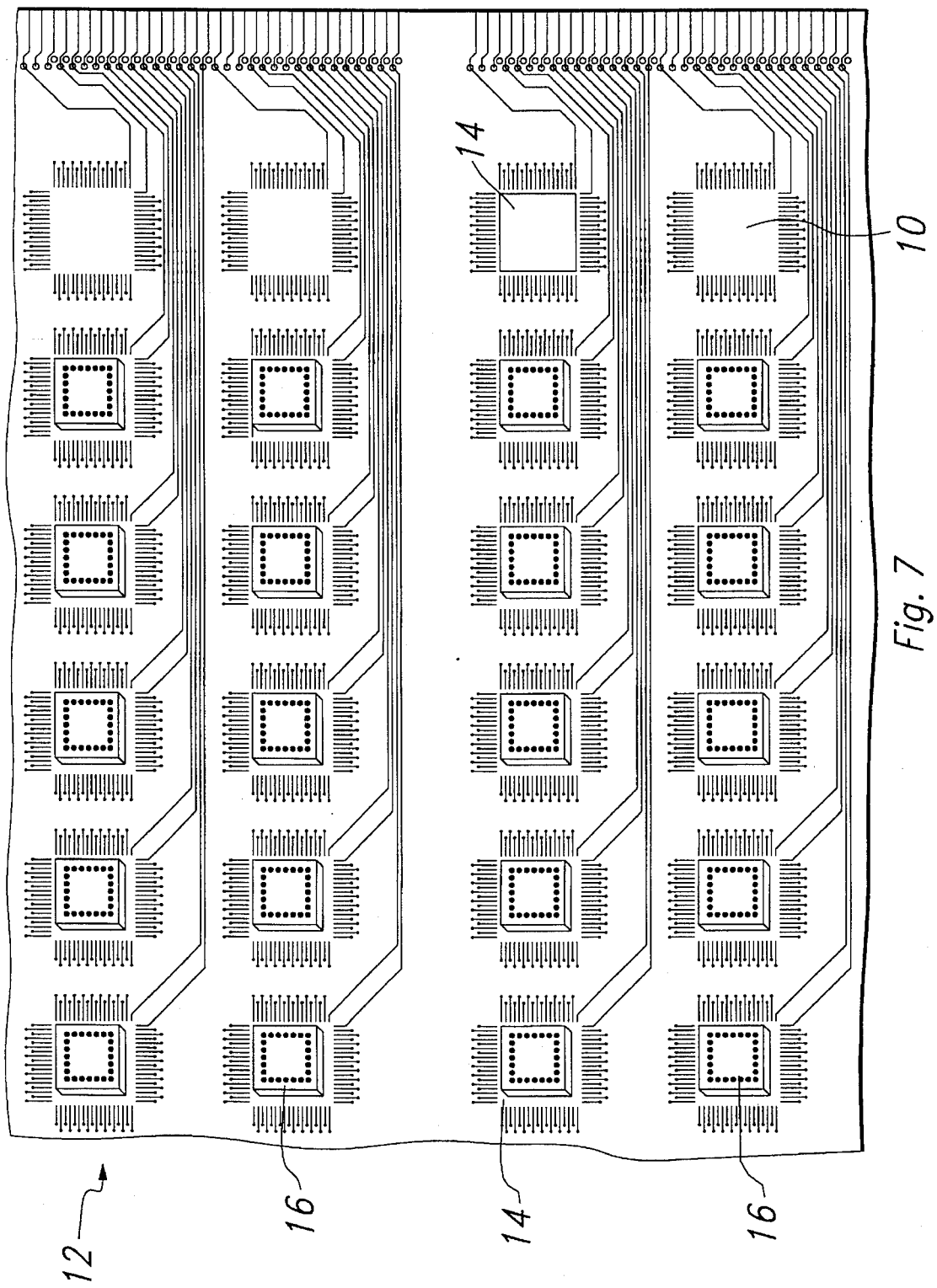
FIG. 7 illustrates the printed wiring board (PWB) of FIG. 6, further including semiconductor devices placed on the die attach films.

In one embodiment of the invention, die attach films used for bonding semiconductor devices to thermal pads 10 of a printed wiring board (PWB) 12, shown in FIG. 5, are sprayed on both sides with a solvent (ALPHA METAL's Staysolv 808) to soften the die attach film (ALPHA's STAYFORM 692) prior to IC die placement. The quantity of solvent applied should be sufficient to coat, but not saturate, the die attach films. The die attach films 14 are then placed on thermal pads 10, shown in FIG. 6, after which semiconductor devices 16 are placed on the die attach films, as shown in FIG. 7. The solvent is allowed to dry after IC die placement. Baking may be performed for short periods of time at temperatures below Tg to expedite drying. Longer periods of time are required if the solvent is allowed to air dry without baking. Semiconductor devices 16 bond to thermal pads 10 upon the drying of the solvent. In either case, fixtures for applying pressure to the dies during attach curing are not required. Semiconductor devices 16 may now be wire or TAB bonded to printed wiring board (PWB) 12.

In another embodiment of the invention, not shown, a solvent (ALPHA's Staysolv 808) is sprayed onto thermal pads 10 of printed wiring board PWB 12. The quantity of solvent applied should be sufficient to coat the surface of thermal pads 10. Die attach films 14 are placed on thermal pads 10 after which die attach films 14 are sprayed with a solvent (ALPHA's Staysolv 808) in quantities sufficient to coat, but not saturate, die attach films 14. Semiconductor devices 16 are placed on die attach films 14. As with the previous embodiment of the invention, the solvent is allowed to dry after IC die placement. Baking may be performed for short periods of time at temperatures below Tg to expedite drying. Longer periods of time are required if the solvent is allowed to air dry without baking. In either case, fixtures for applying pressure to the dies during attach curing are not required. Semiconductor devices 16 may now be wire or TAB bonded to printed wiring board (PWB) 12.

In yet another embodiment of the invention shown, not shown, a solvent (ALPHA's Staysolv 808) is sprayed onto thermal pads 10 of printed wiring board PWB 12. The quantity of solvent applied should be sufficient to coat the surface of thermal pads 10. Die attach films 14 are placed on thermal pads 10, after which the bottom surfaces of semiconductor devices 16 are sprayed with a solvent (ALPHA's Staysolv 808) in quantities sufficient to coat the bottom surfaces of the semiconductor devices. Semiconductor devices 16 are placed on die attach films 14. As with the previous embodiments of the invention, the solvent is allowed to dry after IC die placement. Baking may be performed for short periods of time at temperatures below Tg to expedite drying. Longer periods of time are required if the solvent is allowed to air dry without baking. In either event, fixtures for applying pressure to the dies during attach curing are not required. Semiconductor devices 16 may now be wire or TAB bonded to printed wiring board (PWB) 12.

Figure 8:
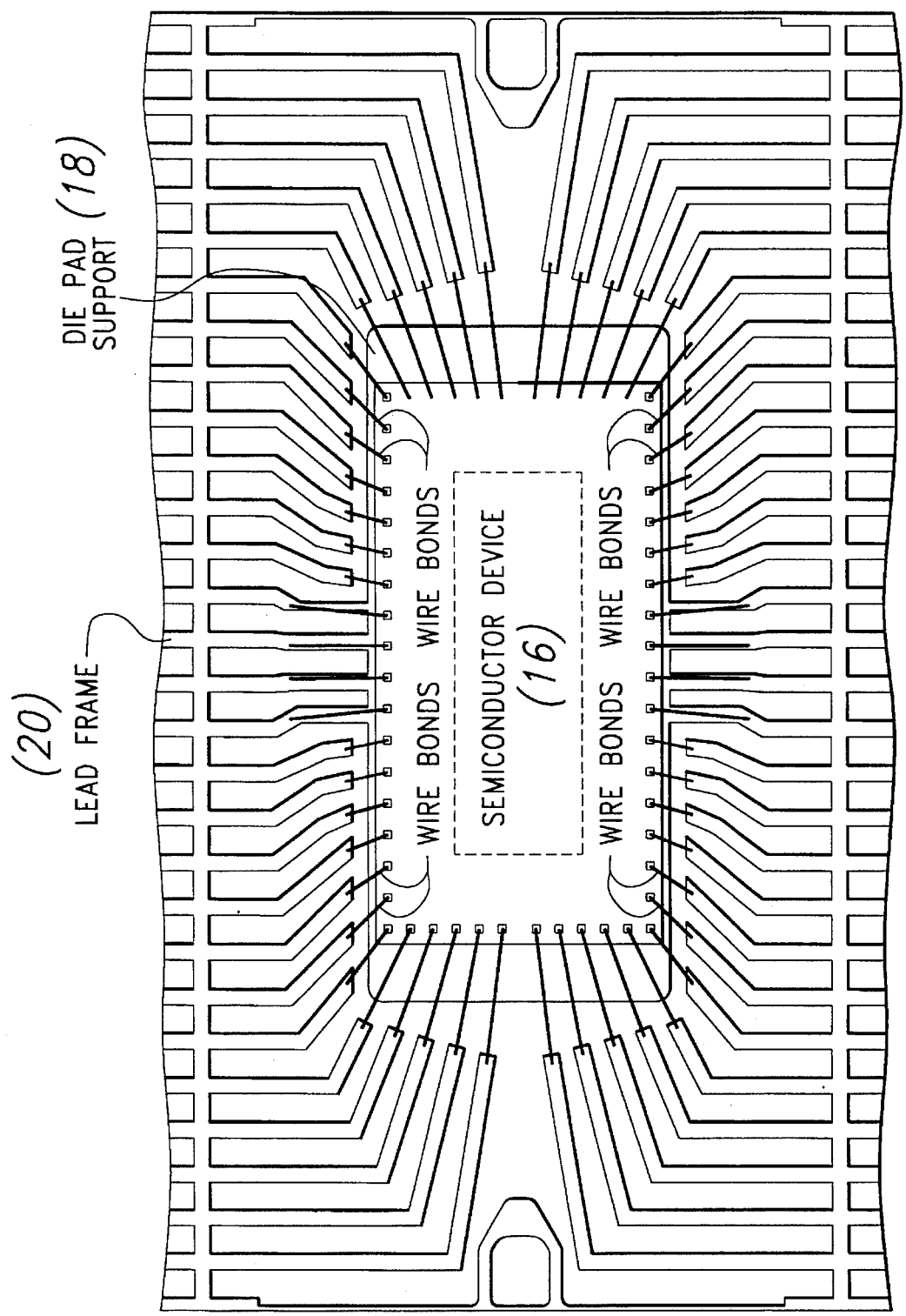
FIG. 8 illustrates a top view of a semiconductor device backbonded and wire bonded to a lead frame prior to packaging, according to an embodiment of the invention.

While traditional die attach curing temperatures are not as destructive to a lead frame bond pad support as they are to a printed wiring board PWB, the present invention may be used to attach semiconductor devices 16 to the die pad supports 18 of lead frames 20, shown in FIG. 8, using any of the previously discussed methods.

Advantages of the embodiments of the invention include: elimination of board warping due to high temperatures excursion, elimination of the costs of the many curing fixtures, reduced labor costs, reduced component damage due to handling, reduced cycle time and easier rework.

While this invention has been described with reference to illustrative embodiments, this description is not to be construed in a limiting sense. Various modifications to the illustrative embodiments, as well as other embodiments of the invention will be apparent to persons skilled in the art upon reference to this description. As an example, while ALPHA's Staysolv 808 is mentioned as the solvent of choice, other solvents having similar characters may be used. It is therefore contemplated that the appended claims will cover any such modifications or embodiments as fall within the true scope of the invention.

What is claimed:

1. A product formed by the process of:

providing a substrate;

providing a die attach film;

coating both sides of said die attach film with a solvent to soften said die attach film;

placing said solvent coated die attach film on said substrate;

placing a semiconductor device on said solvent coated die attach film; and allowing said solvent to dry.

2. The product of claim 1 in which said substrate is a printed wiring board (PWB).

3. The product of claim 1 in which said substrate is a lead frame die pad support.

4. The product of claim 1 in which said die attach film is a thermoplastic film.

5. The product of claim 1 in which said step of allowing said solvent to dry further includes baking said printed wiring board (PWB), said die attach film and said semiconductor device for a short period of time at temperatures below the glass transition temperature (Tg) of the printed wiring board (PWB) to expedite drying.

6. The product formed by the process of claim 1 wherein said solvent coated die attach film is placed on thermal pads on said substrate.

7. A product formed by the process of:

providing a substrate;

providing a die attach film;

coating a portion of said substrate with a solvent capable of softening said die attach film;

coating the backside of a semiconductor device with a solvent capable of softening said die attach film;

placing said die attach film on said solvent portion of said substrate;

placing said semiconductor device on said die attach film; and allowing said solvent coated die attach film to dry.

8. The product of claim 7 in which said substrate is a printed wiring board (PWB).

9. The product of claim 7 in which said substrate is a lead frame die pad support.

10. The product of claim 7 in which said die attach film is a thermoplastic film.

11. The product of claim 7 in which said step of allowing said solvent coated die attach film to dry further includes baking said printed wiring board (PWB), said die attach film and said semiconductor device for a short period of time at temperatures below the glass transition temperature (Tg) of the printed wiring board (PWB) to expedite drying.

12. A product formed by the process of:

providing a substrate;

providing a die attach film;

coating a portion of said substrate with a solvent capable of softening said die attach film;

placing said die attach film on said coated portion of said substrate;

coating the exposed portion of said die attach film with a solvent capable of softening said die attach film;

placing a semiconductor device on said die attach film; and allowing said solvent to dry.

13. The product of claim 12 in which said substrate is a printed wiring board (PWB).

14. The product of claim 12 in which said substrate is a lead frame die pad support.

15. The product of claim 12 in which said die attach film is a thermoplastic film.

16. The product of claim 1 in which the step of allowing said solvent to dry further includes baking said printed wiring board (PWB), said die attach film and said semiconductor device for a short period of time at temperatures below the glass transition temperature (Tg) of the printed wiring board (PWB) to expedite drying.

17. The product of claim 1 in which no fixtures are used to apply pressure to said semiconductor device while said solvent is drying.

18. The product of claim 7 in which no fixtures are used to apply pressure to said semiconductor device while said solvent is drying.

19. The product of claim 12 in which no fixtures are used to apply pressure to said semiconductor device while said solvent is drying.

* * * * *